(12) United States Patent
Dufano (10) Patent No.: US 10,452,142 B1
(45) Date of Patent: Oct. 22, 2019

(54) BACK OF HAND SWITCHING STRUCTURE (71) Applicant: Andrew Dufano, Dallas, GA (US)

(72) Inventor: Andrew Dufano, Dallas, GA (US)

( * ) Notice: Subject to any disclaimer, the term of this patent is extended or adjusted under 35 U.S.C. 154(b) by 53 days.

(21) Appl. No.: 15/906,065

(22) Filed: Feb. 27, 2018

(51) Int. Cl.
*G06F 3/00* (2006.01)
*G06F 3/01* (2006.01)
*H03K 17/96* (2006.01)
*G06F 3/038* (2013.01)
*G06F 3/0346* (2013.01)
*H02J 7/00* (2006.01)

(52) U.S. Cl.
CPC ............ *G06F 3/014* (2013.01); *G06F 3/0346* (2013.01); *G06F 3/0383* (2013.01); *H03K 17/9622* (2013.01); *H02J 7/0042* (2013.01)

(58) Field of Classification Search
CPC ...... G06F 3/014; G06F 3/0346; G06F 3/0383; H03K 17/9622; H02J 7/0042
See application file for complete search history.

(56) References Cited

U.S. PATENT DOCUMENTS

| | | | |
|---|---|---|---|
| 6,850,224 B2 | 2/2005 | Baughman | |
| 7,057,604 B2 | 6/2006 | Bajramovic | |
| 7,092,785 B2 | 8/2006 | Alsio | |
| D576,625 S | 9/2008 | Trigg | |
| 8,125,448 B2 | 2/2012 | Ranta | |
| 2002/0175894 A1 | 11/2002 | Grillo | |
| 2003/0038783 A1* | 2/2003 | Baughman | .......... G06F 3/03543 345/163 |
| 2003/0076296 A1 | 4/2003 | Kolybaba | |
| 2007/0285400 A1 | 12/2007 | Lu | |

FOREIGN PATENT DOCUMENTS

WO       03005176       1/2003

* cited by examiner

*Primary Examiner* — Wing H Chow
(74) *Attorney, Agent, or Firm* — Kyle A. Fletcher, Esq.

(57) ABSTRACT

The back of hand switching structure is a hand-worn switching apparatus. The back of hand switching structure wirelessly communicates with the external device. The back of hand switching structure is worn over the palm. The back of hand switching structure presents a plurality of switches to the thumb. The thumb operates the plurality of switches such that when a switch selected from the plurality of switches is actuated, the back of hand switching structure wirelessly sends an activation signal to the external device. Upon receipt of the activation signal, the external device initiate a previously determined series of actions. In a second potential embodiment of the disclosure, the back of hand switching structure further comprises a sensor structure that senses the environment for data relevant to the operation of the external device. The back of hand switching structure transmits this environmental data to the external device.

16 Claims, 4 Drawing Sheets

BACK OF HAND SWITCHING STRUCTURE

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of instruments and electrical data processing, more specifically, details of data processing equipment not covered by other groups.

SUMMARY OF INVENTION

The back of hand switching structure is a hand-worn switching apparatus. The back of hand switching structure is adapted for use with a hand. The hand is further defined with a palm and a thumb. The back of hand switching structure is configured for use with an externally provided logical device. The back of hand switching structure communicates with the externally provided logical device through a wireless communication link. The back of hand switching structure is worn over the palm. The back of hand switching structure presents a plurality of switches to the thumb of the hand. The thumb operates the plurality of switches such that when a switch selected from the plurality of switches is actuated, the back of hand switching structure sends an activation signal over the wireless communication link to the externally provided logical device. The activation signal will vary according to the switch selected from the plurality of switches. Upon receipt of the activation signal, the externally provided logical device initiates a previously determined series of actions. The previously determined series of actions taken will vary with the specific activation signal received. The back of hand switching structure comprises an elastic band, an operating linkage, and a control circuit. The operating linkage and the control circuit attach to the elastic band. In a second potential embodiment of the disclosure, the back of hand switching structure further comprises a sensor structure that senses the environment for data relevant to the operation of the externally provided logical device. The back of hand switching structure transmits this environmental data to the externally provided logical device.

These together with additional objects, features and advantages of the back of hand switching structure will be readily apparent to those of ordinary skill in the art upon reading the following detailed description of the presently preferred, but nonetheless illustrative, embodiments when taken in conjunction with the accompanying drawings.

In this respect, before explaining the current embodiments of the back of hand switching structure in detail, it is to be understood that the back of hand switching structure is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the back of hand switching structure.

It is therefore important that the claims be regarded as including such equivalent construction insofar as they do not depart from the spirit and scope of the back of hand switching structure. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Detailed reference will now be made to one or more potential embodiments of the disclosure, which are illustrated in FIGS. 1 through 4.

The back of hand switching structure 100 (hereinafter invention) is a switching apparatus. The invention 100 is adapted for use with a hand 192. The hand 192 is further defined with a palm 193 and a thumb 194. The invention 100 is configured for use with an externally provided logical device 191. The invention 100 communicates with the externally provided logical device 191 through a wireless communication link 181. The invention 100 is worn over the palm 193. The invention 100 comprises an elastic band 101, an operating linkage 102, and a control circuit 103. The operating linkage 102 and the control circuit 103 attach to the elastic band 101.

The invention 100 presents a plurality of switches 120 to the thumb 194 of the hand 192. The thumb 194 operates the plurality of switches 120 such that when a switch selected from the plurality of switches 120 is actuated, the invention 100 sends an activation signal over the wireless communication link 181 to the externally provided logical device 191. The activation signal will vary according to the switch selected from the plurality of switches 120. Upon receipt of the activation signal, the externally provided logical device 191 initiates a previously determined series of actions. The previously determined series of actions taken will vary with the specific activation signal received. In a second potential embodiment of the disclosure, the invention 100 further comprises a sensor structure 130 that senses the environment for data relevant to the operation of the externally provided logical device 191. The invention 100 transmits this environmental data to the externally provided logical device 191.

The elastic band 101 attaches the invention 100 to the hand 192. The elastic band 101 is a loop structure that wraps around the palm 193 of the hand 192 during normal use of the invention 100. The elastic band 101 is an elastic textile structure. The elastic textile structure is selected from the group consisting of: 1) a tubular elastic textile; and, 2) an elastic webbing that is sewn upon itself to form a loop.

The elastic band 101 acts as a spring. Specifically, when the palm 193 of the hand 192 inserts into the elastic band 101, the pressing of the hand 192 against the elastic band 101 applies a force that displaces the elastic band 101 in a direction that is perpendicular to the center axis of the elastic band 101. The elasticity of the elastic band 101 creates a force that opposes the displacement created by the insertion of the hand 192 into the elastic band 101. This opposing force is in a direction that returns the elastic band 101 to its relaxed shape. Because the hand 192 prevents the elastic band 101 from returning completely to its relaxed shape, the elastic band 101 applies a force against the hand 192 that holds the elastic band 101 in position.

The operating linkage 102 is a mechanical structure. The operating linkage 102: 1) houses the control circuit 103; and 2) creates an extension structure that allows the thumb 194 of the hand 192 to operate the control circuit 103. The operating linkage 102 comprises a first lever 111, a second lever 112, and a housing 113.

The housing 113 is a hollow rectangular block structure. The housing 113 attaches the first lever 111 and the second lever 112 to the elastic band 101. The housing 113 further contains the control circuit 103. The housing 113 attaches to the elastic band 101 using an adhesive.

The first lever 111 is an extension structure. The first lever 111 extends over the span of distance between the housing 113 and the thumb 194 such that the thumb 194 can touch the first lever 111. The user can interface the control circuit 103 by touching the first lever 111 with the thumb 194. The first lever 111 comprises a first hyoid structure 141 and a first paddle 142. The first hyoid structure 141 is further defined with a first end 151 and a second end 152. The first paddle 142 is further defined with a first upper surface 155. The first upper surface 155 is the end of the first paddle 142 that is proximal to the first hyoid structure 141.

The first hyoid structure 141 is U shaped shaft used as an extension structure. The first hyoid structure 141 extends the span of the distance between the control circuit 103 and the thumb 194 such that the thumb 194 can actuate a first switch 121 attached to the first paddle 142. The first end 151 of the first hyoid structure 141 attaches to the housing 113. The U shape of the first hyoid structure 141 moves the first hyoid structure 141 out of the range of motion of the hand 192.

The first paddle 142 is a prism-shaped plate structure such as a disk. The first paddle 142 attaches to the second end 152 of the first hyoid structure 141. The first upper surface 155 of the first paddle 142 attaches perpendicularly to the center axis of the first hyoid structure 141 as presented at the second end 152. The first switch 121 attaches to the first upper surface 155 of the first paddle 142 such that the thumb 194 can touch the first switch 121.

The second lever 112 is an extension structure. The second lever 112 extends over the span of distance between the housing 113 and the thumb 194 such that the thumb 194 can touch the second lever 112. The user can interface the control circuit 103 by touching the second lever 112 with the thumb 194. The second lever 112 comprises a second hyoid structure 143 and a second paddle 144. The second hyoid structure 143 is further defined with a third end 153 and a fourth end 154. The second paddle 144 is further defined with a second upper surface 156. The second upper surface 156 is the end of the second paddle 144 that is proximal to the second hyoid structure 143.

The second hyoid structure 143 is U shaped shaft used as an extension structure. The second hyoid structure 143 extends the span of the distance between the control circuit 103 and the thumb 194 such that the thumb 194 can actuate the second switch 122 attached to the second paddle 144. The third end 153 of the second hyoid structure 143 attaches to the housing 113. The U shape of the second hyoid structure 143 moves the second hyoid structure 143 out of the range of motion of the hand 192.

The second paddle 144 is a prism-shaped plate structure such as a disk. The second paddle 144 attaches to the fourth end 154 of the second hyoid structure 143. The second upper surface 156 of the second paddle 144 attaches perpendicularly to the center axis of the second hyoid structure 143 as presented at the fourth end 154. The second switch 122 attaches to the second upper surface 156 of the second paddle 144 such that the thumb 194 can touch the second switch 122.

Figure 1:
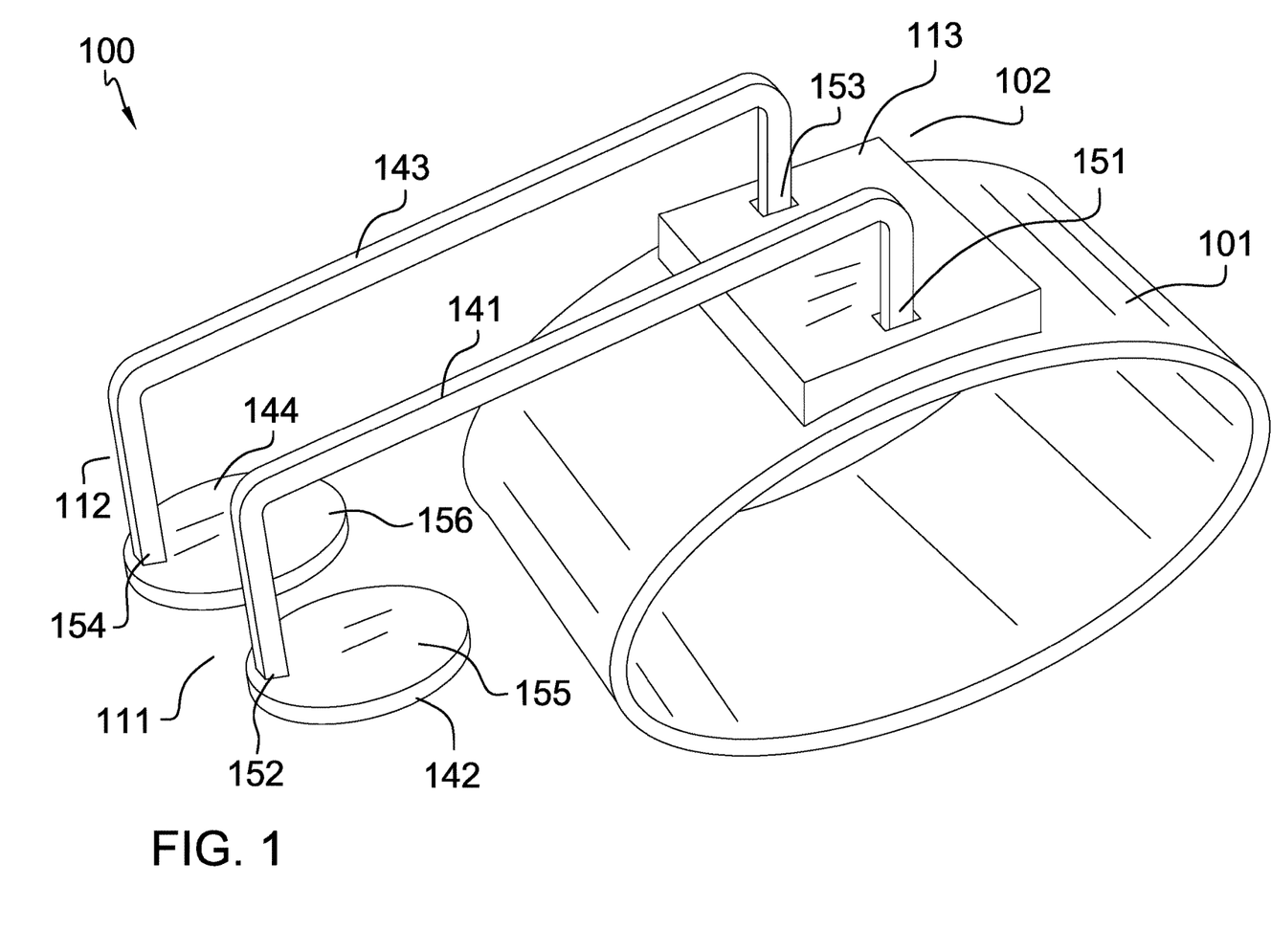
FIG. 1 is a perspective view of an embodiment of the disclosure.
Figure 2:
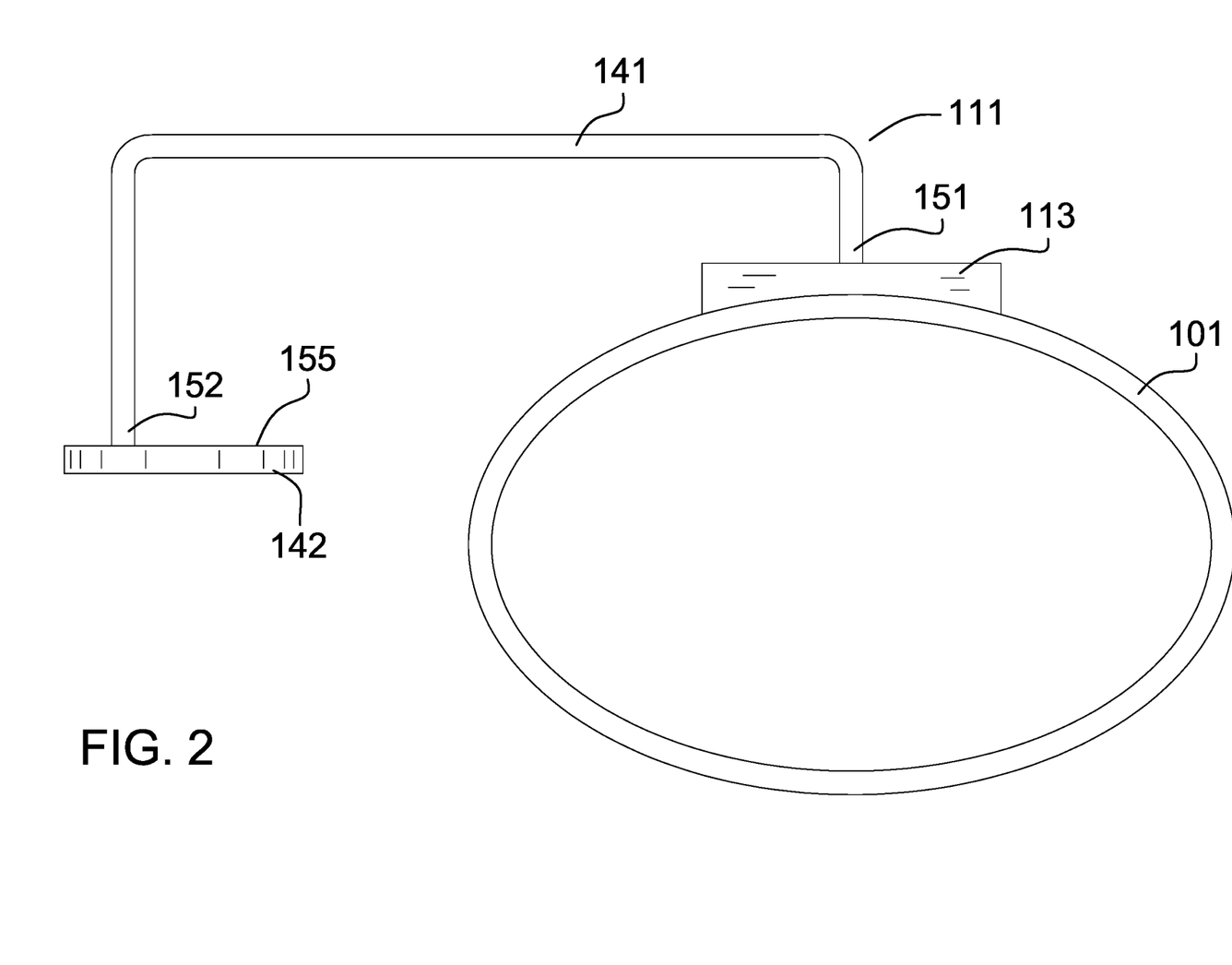
FIG. 2 is a front view of an embodiment of the disclosure.
Figure 3:
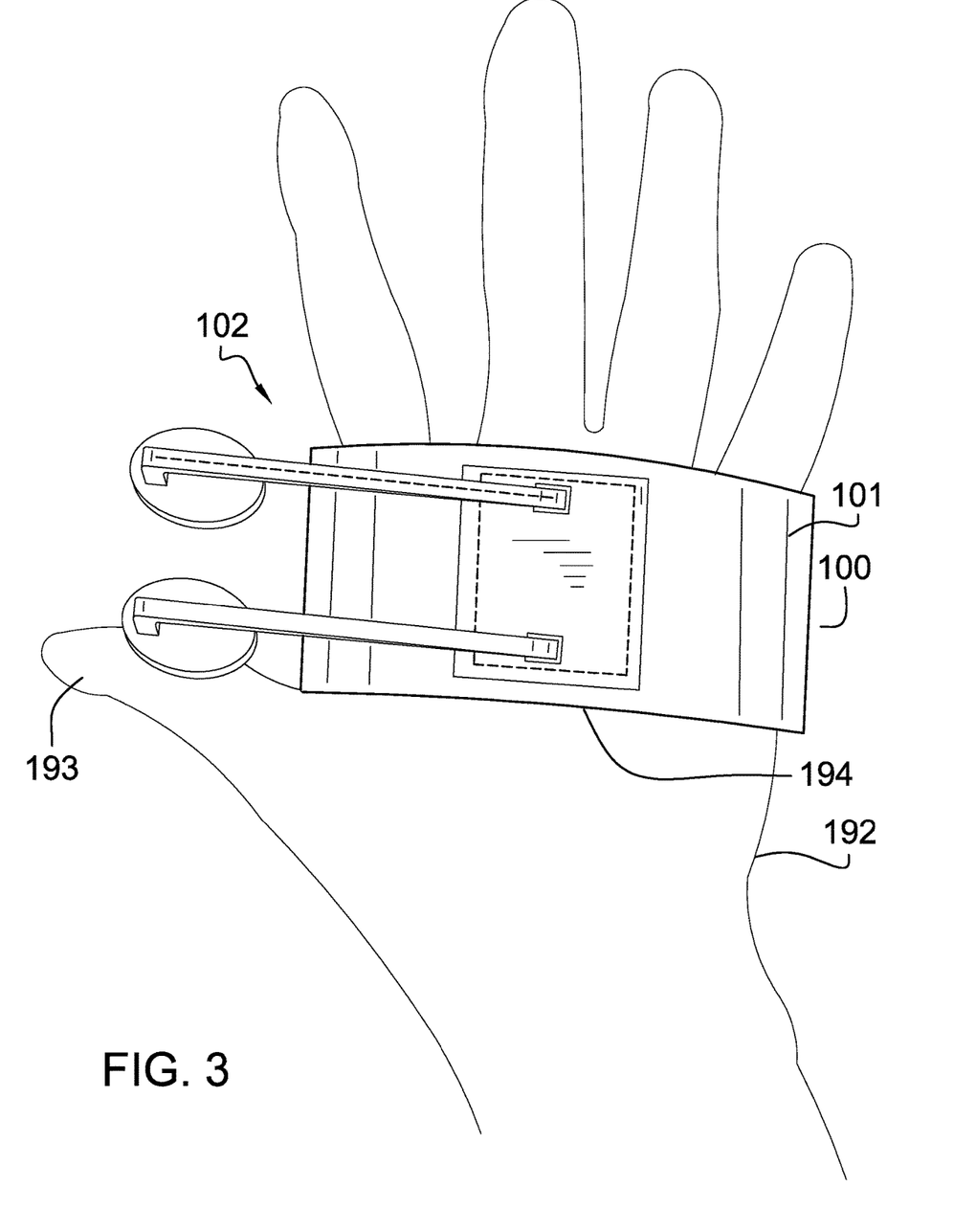
FIG. 3 is an in-use view of an embodiment of the disclosure.
Figure 4:
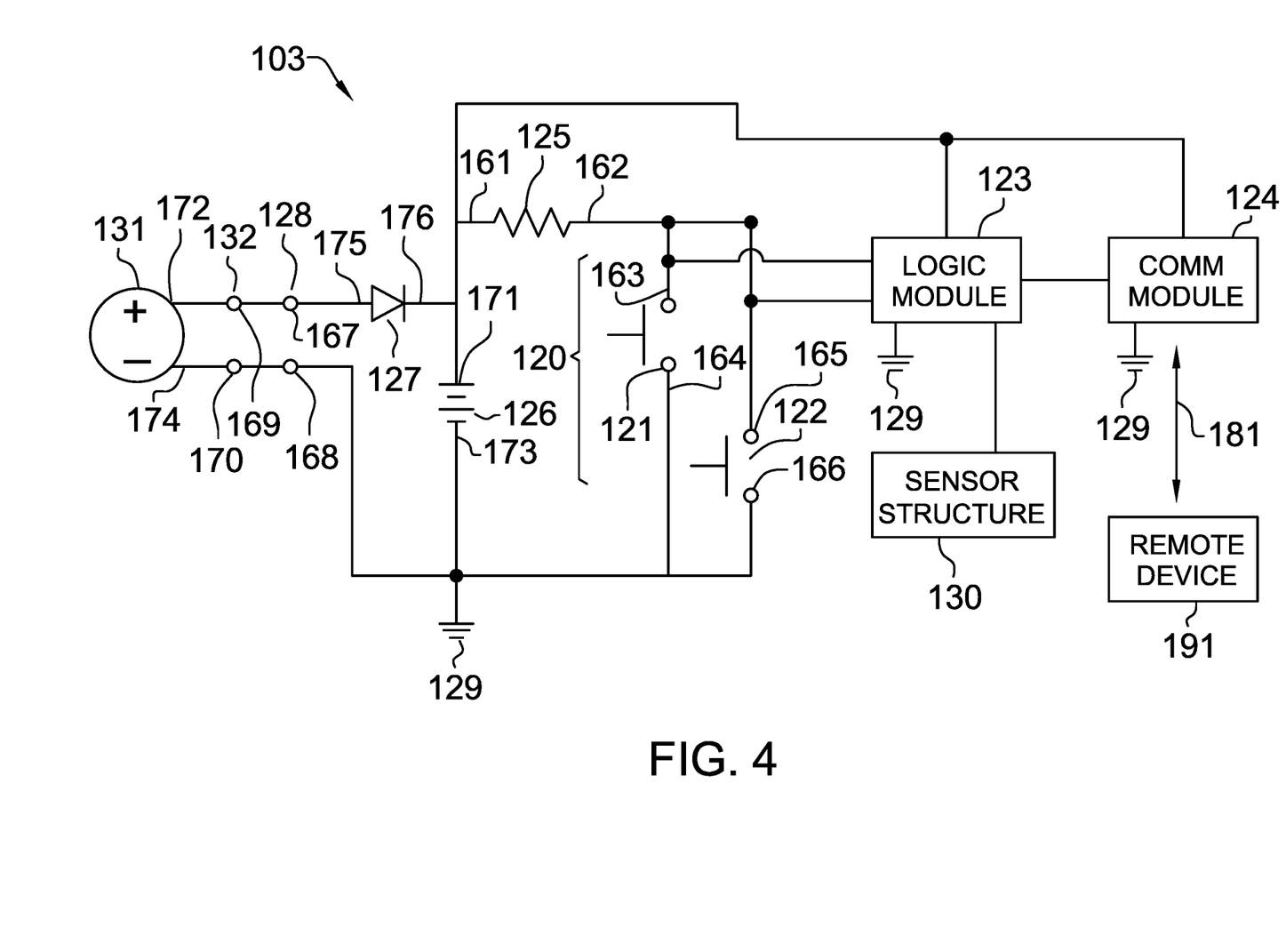
FIG. 4 is a block diagram of an embodiment of the disclosure.

The control circuit 103 is an electrical circuit that forms an interface between the thumb 194 and the externally provided logical device 191. The control circuit 103 comprises a plurality of switches 120, a logic module 123, a communication module 124, a limit resistor 125, a battery 126, a diode 127, a charging port 128, and an electrical ground 129. The control circuit 103 is configured to work with an external power source 131. The external power source 131 further comprises a charging plug 132.

The limit resistor 125 is further defined with a first lead 161 and a second lead 162. The first switch 121 is further defined with a third lead 163 and a fourth lead 164. The second switch 122 is further defined with a fifth lead 165 and a sixth lead 166. The charging port 128 is further defined with a seventh lead 167 and an eighth lead 168. The charging plug 132 is further defined with a ninth lead 169 and a tenth lead 170. The battery 126 is further defined with a first positive terminal 171 and a second positive terminal 172. The external power source 131 is further defined with a first negative terminal 173 and a second negative terminal 174. The diode 127 is further defined with an anode 175 and a cathode 176.

Each of the plurality of switches 120 is a touch-sensitive capacitive switch. The plurality of switches 120 are identical. Each of the plurality of switches 120 is accessible from the thumb 194. The plurality of switches 120 forms an interface between the user and the control circuit 103 that is operated by the thumb 194. The plurality of switches 120 comprises a first switch 121 and a second switch 122. The first switch 121 is a capacitive switch. The sensing surface of the first switch 121 mounts to the first upper surface 155 of the first paddle 142. The second switch 122 is a capacitive switch. The sensing surface of the second switch 122 mounts to the second upper surface 156 of the second paddle 144.

The limit resistor 125 is an electrical resistor. The limit resistor 125 is a protective element that limits the flow of electric current through the first switch 121 and the second switch 122. The electrical ground 129 is a common reference voltage used throughout the control circuit 103.

The logic module 123 is a readily and commercially available programmable electronic device that is used to manage, regulate, and operate the control circuit 103. Depending on the specific design and the selected components, the logic module 123 can be a separate component within the control circuit 103 or the functions of the logic module 123 can be incorporated into another component within the control circuit 103. The communication module 124 is a wireless electronic communication device that allows the logic module 123 to communicate with the externally provided logical device 191 wirelessly. Specifically, the communication module 124 establishes the wireless communication link 181 between the control circuit 103 and the externally provided logical device 191. In the first potential embodiment of the disclosure, the communication module 124 supports a communication protocol selected from the group consisting of a WiFi protocol or a Bluetooth protocol. In the first potential embodiment of the disclosure, the functions of the logic module 123 and the communication module 124 are combined into one component marketed as an ESP8266 (Expressif) integrated circuit.

The battery 126 is a commercially available rechargeable battery 126. The chemical energy stored within the rechargeable battery 126 is renewed and restored through the use of the charging port 128. The charging port 128 is an electrical circuit that reverses the polarity of the rechargeable battery 126 and provides the energy necessary to reverse the chemical processes that the rechargeable battery 126 initially used to generate the electrical energy. This reversal of the chemical process creates a chemical potential energy that will later be used by the rechargeable battery 126 to generate electricity. The charging port 128 attaches to an external power source 131 using a charging plug 132. The charging port 128 receives electrical energy from the external power source 131 through the charging plug 132. The diode 127 is an electrical device that allows current to flow in only one direction. The diode 127 is installed between the rechargeable battery 126 and the charging port 128 such that electricity will not flow from the first positive terminal 171 of the rechargeable battery 126 into the second positive terminal 172 of the external power source 131. In the first potential embodiment of the disclosure, the external power source 131 and the charging port 128 are compatible with USB power requirements.

In the second potential embodiment of the disclosure, the control circuit 103 further comprises a sensor structure 130. The sensor structure 130 is a supplemental sensing device that is monitored by the logic module 123. In the first potential embodiment of the disclosure, this disclosure assumes that the sensor structure 130 measures the motion of the sensor structure 130 as projected on a reference plane. The term projected is meant in its mathematical sense of taking a three-dimensional object and compressing (projecting) it into a two-dimensional reference. Methods to incorporate sensors into logic modules 123 are well-known and documented in the electrical arts.

The following four paragraphs describe the assembly of the control circuit 103.

The second positive terminal 172 of the external power source 131 electrically connects to the ninth lead 169 of the charging plug 132. The second negative terminal 174 of the external power source 131 electrically connects to the tenth lead 170 of the charging plug 132. The ninth lead 169 of the charging plug 132 electrically connects to the seventh lead 167 of the charging port 128 when the charging plug 132 inserts into the charging port 128. The tenth lead 170 of the charging plug 132 electrically connects to the eighth lead 168 of the charging port 128 when the charging plug 132 inserts into the charging port 128.

The seventh lead 167 of the charging port 128 electrically connects to the anode 175 of the diode 127. The cathode 176 of the diode 127 electrically connects to the first positive terminal 171 of the battery 126. The first positive terminal 171 of the battery 126 electrically connects to the first lead 161 of the limit resistor 125. The first positive terminal 171 of the battery 126 electrically connects as a power source for the logic module 123. The first positive terminal 171 of the battery 126 electrically connects as a power source for the communication module 124.

The second lead 162 of the limit resistor 125 electrically connects to the third lead 163 of the first switch 121. The second lead 162 of the limit resistor 125 electrically connects to the fifth lead 165 of the second switch 122. The logic module 123 electrically connects to and monitors the voltage at the third lead 163 of the first switch 121. The logic module 123 electrically connects to and monitors the voltage at the fifth lead 165 of the second switch 122.

The logic module 123 electrically connects to the electrical ground 129. The communication module 124 electrically connects to the electrical ground 129. The eighth lead 168 of the charging port 128 electrically connects to the electrical ground 129. The first negative terminal 173 of the battery 126 electrically connects to the electrical ground 129. The fourth lead 164 of the first switch 121 electrically connects to the electrical ground 129. The sixth lead 166 of the second switch 122 electrically connects to the electrical ground 129.

The following definitions were used in this disclosure:

Adhesive: As used in this disclosure, an adhesive is a chemical substance that can be used to adhere two or more objects to each other. Types of adhesives include, but are not limited to, epoxies, polyurethanes, polyimides, or cyanoacrylates, silicone, or latex based adhesives.

Anodes and Cathodes: As used in this disclosure, an anode and a cathode are the connecting terminals of an electrical circuit element or device. Technically, the cathode is the terminal through which the physical electrons flow into the device. The anode is the terminal through which the physical electrons flow out of the device. As a practical matter, the anode refers to: 1) the positive terminal of a power consuming electrical circuit element; 2) the negative terminal of a discharging battery or an electrical power source; and, 3) the positive terminal of a charging battery. As a further practical matter the cathode refers to: 1) the negative terminal of a power consuming electrical circuit element; 2) the positive terminal of a discharging battery or an electrical power source; and, 3) the negative terminal of a charging battery.

Battery: As used in this disclosure, a battery is a chemical device consisting of one or more cells, in which chemical energy is converted into electricity and used as a source of power.

Bluetooth: As used in this disclosure, Bluetooth is a standardized communication protocol that is used to wirelessly interconnect electronic devices.

Capacitive Switch: As used in this disclosure, a capacitive switch is a switching device. The capacitive switch presents a sensing surface that is energized such that a known electric field is generated within the sensing surface. When the sensing surface is touched by an electrically conductive object, such as human skin, the electric field within the sensing surface is disrupted. This disruption actuates the capacitive switch.

Center: As used in this disclosure, a center is a point that is: 1) the point within a circle that is equidistant from all the points of the circumference; 2) the point within a regular polygon that is equidistant from all the vertices of the regular polygon; 3) the point on a line that is equidistant from the ends of the line; 4) the point, pivot, or axis around which something revolves; or, 5) the centroid or first moment of an area or structure. In cases where the appropriate definition or definitions are not obvious, the fifth option should be used in interpreting the specification.

Center Axis: As used in this disclosure, the center axis is the axis of a cylinder or a prism. The center axis of a prism is the line that joins the center point of the first congruent face of the prism to the center point of the second corresponding congruent face of the prism. The center axis of a pyramid refers to a line formed through the apex of the pyramid that is perpendicular to the base of the pyramid. When the center axes of two cylinder, prism or pyramidal structures share the same line they are said to be aligned. When the center axes of two cylinder, prism or pyramidal structures do not share the same line they are said to be offset.

Control Circuit: As used in this disclosure, a control circuit is an electrical circuit that manages and regulates the behavior or operation of a device.

Diode: As used in this disclosure, a diode is a two terminal semiconductor device that allows current flow in only one direction. The two terminals are called the anode and the cathode. Electric current is allowed to pass from the anode to the cathode.

Disk: As used in this disclosure, a disk is a cylindrically shaped object that is flat in appearance.

Elastic: As used in this disclosure, an elastic is a material or object that deforms when a force is applied to it and that is able to return to its relaxed shape after the force is removed. A material that exhibits these qualities is also referred to as an elastomeric material.

Elastic Band: As used in this disclosure, an elastic band is a loop of textile that is formed using elastic material that can stretched. Alternatively, the elastic band can be a sheeting formed from latex, spandex, or an elastic plastic film.

Elastic Textile: As used in this disclosure, an elastic textile is a textile that contains elastic yarns as some of the yarns that make up the textile. An elastic textile is constructed such that the elastic textile will stretch when a force is applied and will return to its original shape when after the force is removed.

Elastic Webbing: As used in this disclosure, an elastic webbing is a webbing that contains elastic yarns as some of the yarns that make up the webbing. An elastic webbing is constructed such that the elastic webbing will stretch when a force is applied and will return to its original shape when after the force is removed.

Electrical Ground: As used in this disclosure, an electrical ground is a common reference voltage used in the design and implementation of electrical circuits. An electrical ground is often, but not necessarily, the discharge point of electric currents flowing through an electric circuit.

Extension Structure: As used in this disclosure, an extension structure is an inert physical structure that is used to extend the span of the distance between any two objects.

External Power Source: As used in this disclosure, an external power source is a source of the energy that is externally provided to enable the operation of the present disclosure. Examples of external power sources include, but are not limited to, electrical power sources and compressed air sources.

Hyoid: As used in this disclosure, a hyoid refers to a three-sided structure comprising a crossbeam, a first arm, and a second arm. In a hyoid, the first arm and the second arm project away from the crossbeam: 1) in the same direction; 2) at a roughly perpendicular angle to the crossbeam, and, 3) the span of the length of the first arm roughly equals the span of the length of the second arm. Hyoids generally have a U shaped appearance.

IEEE: As used in this disclosure, the IEEE (pronounced "I triple E") is an acronym for the Institute of Electrical and Electronic Engineers.

Interface: As used in this disclosure, an interface is a physical or virtual boundary that separates two different systems across which information is exchanged.

Lead: As used in this disclosure, a lead is a conductor that is physically used to connect an electrical component to a larger circuit assembly electrically.

Limit Resistor: As used in this disclosure, a limit resistor is an electrical resistor that is used to limit the flow of electric current through an electrical circuit.

Logic Module: As used in this disclosure, a logic module is a readily and commercially available electrical device that is programmable and that accepts digital and analog inputs, processes the digital and analog inputs according to previously stored instruction and provides the results of these instructions as digital or analog outputs.

Logical Device: As used in this disclosure, a logical device is an electrical device that processes externally provided inputs to generate outputs that are determined from one or more previously determined logical functions. A logical device may or may not be programmable.

Loop: As used in this disclosure, a loop is the length of a first linear structure including, but not limited to, shafts, lines, cords, or ribbons, that is: 1) folded over and joined at the ends forming an enclosed space; or, 2) curved to form a closed or nearly closed space within the first linear structure. In both cases, the space formed within the first linear structure is such that a second linear structure such as a line, cord or a hook can insert through the space formed within the first linear structure. Within this disclosure, the first linear structure is said to be looped around the second linear structure.

Palm: As used in this disclosure, the palm is identified as the portions of a left hand and a right hand between the fingers and the wrist that contact each other when: 1) the left hand presses against the right hand; and, 2) the left hand and right hand are in alignment. The palm of the left hand is the mirror image of the palm of the right hand.

Plate: As used in this disclosure, a plate is a smooth, flat and rigid object that has at least one dimension that: 1) is of uniform thickness; and 2) that appears thin relative to the other dimensions of the object. Plates often have a rectangular or disk-like appearance.

Plug: As used in this disclosure, a plug is an electrical termination that electrically connects a first electrical circuit to a second electrical circuit or a source of electricity. As used in this disclosure, a plug will have two or three metal pins.

Port: As used in this disclosure, a port is an electrical termination that is used to connect a first electrical circuit to a second external electrical circuit. In this disclosure, the port is designed to receive a plug.

Prism: As used in this disclosure, a prism is a three-dimensional geometric structure wherein: 1) the form factor of two faces of the prism are congruent; and, 2) the two congruent faces are parallel to each other. The two congruent faces are also commonly referred to as the ends of the prism. The surfaces that connect the two congruent faces are called the lateral faces. In this disclosure, when further description is required a prism will be named for the geometric or descriptive name of the form factor of the two congruent faces. If the form factor of the two corresponding faces has no clearly established or well-known geometric or descriptive name, the term irregular prism will be used. The center axis of a prism is defined as a line that joins the center point of the first congruent face of the prism to the center point of the second corresponding congruent face of the prism. The center axis of a prism is otherwise analogous to the center axis of a cylinder. A prism wherein the ends are circles is commonly referred to as a cylinder.

Resistor: As used in this disclosure, a resistor is a well-known and commonly available electrical device that inhibits the flow of electricity through an electric circuit. Within an electric circuit processing alternating currents, the resistor will not affect the phase of the alternating current. A current flowing through a resistor will create a voltage across the terminals of the resistor.

Sensor: As used in this disclosure, a sensor is a device that receives and responds in a predetermined way to a signal or stimulus. As further used in this disclosure, a threshold sensor is a sensor that generates a signal that indicates whether the signal or stimulus is above or below a given threshold for the signal or stimulus.

Spring: As used in this disclosure, a spring is a device that is used to store mechanical energy. This mechanical energy will often be stored by: 1) deforming an elastomeric material that is used to make the device; 2) the application of a torque to a rigid structure; or 3) a combination of the previous two items.

Switch: As used in this disclosure, a switch is an electrical device that starts and stops the flow of electricity through an electric circuit by completing or interrupting an electric circuit. The act of completing or breaking the electrical circuit is called actuation. Completing or interrupting an electric circuit with a switch is often referred to as closing or opening a switch respectively. Completing or interrupting an electric circuit is also often referred to as making or breaking the circuit respectively.

Terminal: As used in this disclosure, a terminal is the end point of a conductor. A terminal can be the conducting wire itself or may have attached to is a device designed to facilitate an electrical connection.

Textile: As used in this disclosure, a textile is a material that is woven, knitted, braided or felted. Synonyms in common usage for this definition include fabric and cloth.

Tubular Textile: As used in this disclosure, a tubular textile is a textile that is woven, knitted, or braided into a seamless tube-like shape.

USB: As used in this disclosure, USB is an acronym for Universal Serial Bus, which is an industry standard that defines the cables, the connectors, the communication protocols and the distribution of power required for interconnections between electronic devices. The USB standard defines several connectors including, but not limited to, USB-A, USB-B, mini-USB, and micro USB connectors.

Webbing: As used in this disclosure, a webbing is strong, close woven or knitted fabric that is used for straps or belting. As used in this disclosure, webbing is a fully formed material that is only cut to length for use. Webbing is not formed by cutting broader materials into strips.

WiFi: As used in this disclosure, WiFi refers to the physical implementation of a collection of wireless electronic communication standards commonly referred to as IEEE 802.11x.

Wireless: As used in this disclosure, wireless is an adjective that is used to describe a communication channel between two terminals that does not require the use of physical cabling.

With respect to the above description, it is to be realized that the optimum dimensional relationship for the various components of the invention described above and in FIGS. 1 through 4 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. A data processing device comprising:
an elastic band, an operating linkage, and a control circuit;
wherein the operating linkage and the control circuit attach to the elastic band;
wherein the data processing device is a switching apparatus;
wherein the data processing device is adapted for use with a hand;
wherein the data processing device is worn over the palm;
wherein the hand is further defined with a palm and a thumb;
wherein the data processing device presents a plurality of switches to the thumb of the hand;
wherein the operating linkage comprises a first lever, a second lever, and a housing;
wherein the housing attaches the first lever and the second lever to the elastic band;
wherein the housing further contains the control circuit;
wherein the housing is a hollow rectangular block structure;
wherein the housing attaches to the elastic band using an adhesive;
wherein the first lever is an extension structure;
wherein the second lever is an extension structure;
wherein the first lever extends over the span of distance between the housing and the thumb such that the thumb can touch the first lever;
wherein the second lever extends over the span of distance between the housing and the thumb such that the thumb can touch the second lever;
wherein the thumb interfaces the control circuit by touching the first lever;
wherein the thumb interfaces the control circuit by touching the second lever;
wherein the first lever comprises a first hyoid structure and a first paddle;
wherein the first hyoid structure is further defined with a first end and a second end;

wherein the first paddle attaches to the second end of the first hyoid structure;
wherein the first paddle is further defined with a first upper surface;
wherein the second lever comprises a second hyoid structure and a second paddle;
wherein the second hyoid structure is further defined with a third end and a fourth end;
wherein the second paddle attaches to the fourth end of the second hyoid structure;
wherein the second paddle is further defined with a second upper surface.

2. The data processing device according to claim 1
wherein the data processing device is configured for use with an externally provided logical device;
wherein the data processing device communicates an activation signal with the externally provided logical device through a wireless communication link;
wherein the thumb operates the plurality of switches;
wherein any switch selected from the plurality of switches initiates the transmission of the activation signal;
wherein the activation signal varies according to the switch selected from the plurality of switches;
wherein the elastic band is a loop structure that wraps around the palm;
wherein the operating linkage is a mechanical structure;
wherein the operating linkage houses the control circuit;
wherein the operating linkage creates an extension structure between the thumb and the control circuit;
wherein the control circuit is an electrical circuit that forms an interface between the thumb and the externally provided logical device.

3. The data processing device according to claim 2
wherein the elastic band is an elastic textile;
wherein the elastic textile structure is selected from the group consisting of: A) a tubular elastic textile; and, B) an elastic webbing that is sewn upon itself to form a loop;
wherein the elastic band from returning completely to its relaxed shape, the elastic band applies a force against the hand that holds the elastic band in position.

4. The data processing device according to claim 3
wherein the first hyoid structure is U shaped shaft used as an extension structure;
wherein the first hyoid structure extends the span of the distance between the control circuit and the thumb;
wherein the first end of the first hyoid structure attaches to the housing;
wherein the first paddle is a prism-shaped plate structure;
wherein the second hyoid structure is U shaped shaft used as an extension structure;
wherein the second hyoid structure extends the span of the distance between the control circuit and the thumb;
wherein the third end of the second hyoid structure attaches to the housing;
wherein the second paddle is a prism-shaped plate structure.

5. The data processing device according to claim 4
wherein the first upper surface of the first paddle attaches perpendicularly to the center axis of the first hyoid structure;
wherein the second upper surface of the second paddle attaches perpendicularly to the center axis of the second hyoid structure as presented at the fourth end.

6. The data processing device according to claim 5
wherein the control circuit comprises a plurality of switches, a logic module, a communication module, a limit resistor, a battery, a diode, a charging port, and an electrical ground;
wherein the plurality of switches, the logic module, the communication module, the limit resistor, the battery, the diode, the charging port, and the electrical ground are electrically interconnected;
wherein the limit resistor is further defined with a first lead and a second lead;
wherein the first switch is further defined with a third lead and a fourth lead;
wherein the second switch is further defined with a fifth lead and a sixth lead;
wherein the charging port is further defined with a seventh lead and an eighth lead;
wherein the charging plug is further defined with a ninth lead and a tenth lead;
wherein the battery is further defined with a first positive terminal and a second positive terminal.

7. The data processing device according to claim 6
wherein the control circuit is configured to work with an external power source;
wherein the external power source further comprises a charging plug;
wherein the external power source is further defined with a first negative terminal and a second negative terminal;
wherein the diode is further defined with an anode and a cathode.

8. The data processing device according to claim 7
wherein each of the plurality of switches is a touch-sensitive capacitive switch;
wherein the plurality of switches are identical;
wherein each of the plurality of switches is accessible by the thumb;
wherein the plurality of switches forms an interface between the thumb and the control circuit.

9. The data processing device according to claim 8
wherein the plurality of switches comprises a first switch and a second switch;
wherein the first switch attaches to the first upper surface of the first paddle;
wherein the second switch attaches to the second upper surface of the second paddle.

10. The data processing device according to claim 9
wherein the logic module is a programmable electronic device;
wherein the communication module is a wireless electronic communication device;
wherein the communication module establishes the wireless communication link;
wherein the limit resistor is an electrical resistor;
wherein the limit resistor is a protective element that limits the flow of electric current through the first switch and the second switch;
wherein the electrical ground is a reference voltage.

11. The data processing device according to claim 10
wherein the battery is a rechargeable battery;
wherein the charging port is an electrical circuit that reverses the polarity of the rechargeable battery;
wherein the charging port attaches to the external power source using the charging plug;
wherein the charging port receives electrical energy from the external power source through the charging plug;
wherein the diode is an electrical device that allows current to flow in only one direction;

wherein the diode is installed between the rechargeable battery and the charging port such that electricity will not flow from the first positive terminal of the rechargeable battery into the second positive terminal of the external power source.

12. The data processing device according to claim 11
wherein the control circuit further comprises a sensor structure;
wherein the sensor structure is a sensing device;
wherein the sensor structure is monitored by the logic module;
wherein the sensor structure senses the environment for data relevant to the operation of the externally provided logical device;
wherein the data processing device transmits this environmental data to the externally provided logical device.

13. The data processing device according to claim 11
wherein the second positive terminal of the external power source electrically connects to the ninth lead of the charging plug;
wherein the second negative terminal of the external power source electrically connects to the tenth lead of the charging plug;
wherein the ninth lead of the charging plug electrically connects to the seventh lead of the charging port when the charging plug inserts into the charging port;
wherein the tenth lead of the charging plug electrically connects to the eighth lead of the charging port when the charging plug inserts into the charging port.

14. The data processing device according to claim 13
wherein the seventh lead of the charging port electrically connects to the anode of the diode;
wherein the cathode of the diode electrically connects to the first positive terminal of the battery;
wherein the first positive terminal of the battery electrically connects to the first lead of the limit resistor;
wherein the first positive terminal of the battery electrically connects as a power source for the logic module;
wherein the first positive terminal of the battery electrically connects as a power source for the communication module;
wherein the second lead of the limit resistor electrically connects to the third lead of the first switch;
wherein the second lead of the limit resistor electrically connects to the fifth lead of the second switch;
wherein the logic module electrically connects to and monitors the voltage at the third lead of the first switch;
wherein the logic module electrically connects to and monitors the voltage at the fifth lead of the second switch.

15. The data processing device according to claim 14
wherein the logic module electrically connects to the electrical ground;
wherein the communication module electrically connects to the electrical ground;
wherein the eighth lead of the charging port electrically connects to the electrical ground;
wherein the first negative terminal of the battery electrically connects to the electrical ground;
wherein the fourth lead of the first switch electrically connects to the electrical ground;
wherein the sixth lead of the second switch electrically connects to the electrical ground.

16. The data processing device according to claim 15
wherein the control circuit further comprises a sensor structure;
wherein the sensor structure is a sensing device;
wherein the sensor structure is monitored by the logic module;
wherein the sensor structure senses the environment for data relevant to the operation of the externally provided logical device;
wherein the data processing device transmits this environmental data to the externally provided logical device.

* * * * *